(12) United States Patent
Mizumura et al.

(10) Patent No.: US 7,256,659 B2
(45) Date of Patent: Aug. 14, 2007

(54) TEMPERATURE COMPENSATED CRYSTAL OSCILLATOR AND METHOD OF MANUFACTURING SAME

(75) Inventors: Hiroaki Mizumura, Saitama (JP); Akio Yamazaki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 116 days.

(21) Appl. No.: 11/293,870

(22) Filed: Dec. 2, 2005

(65) Prior Publication Data

US 2006/0139115 A1  Jun. 29, 2006

(30) Foreign Application Priority Data

Dec. 3, 2004 (JP) .............................. 2004-351159

(51) Int. Cl.
  H03B 5/32 (2006.01)
  H03H 9/10 (2006.01)
(52) U.S. Cl. .................. 331/68; 331/108 D; 331/158; 310/348; 310/344
(58) Field of Classification Search .................. 331/68, 331/108 D
  See application file for complete search history.

(56) References Cited

U.S. PATENT DOCUMENTS 5,500,628 A * 3/1996 Knecht ........................ 331/68
6,456,168 B1 * 9/2002 Luff ............................. 331/68
6,759,913 B2 * 7/2004 Biernacki .................... 331/68
2003/0001682 A1 * 1/2003 Biernacki .................... 331/68
2004/0135645 A1 * 7/2004 Koyama et al. ............ 331/158
2006/0055478 A1 * 3/2006 Isimaru ....................... 331/158
2006/0267451 A1 * 11/2006 Horie et al. ................. 310/311

FOREIGN PATENT DOCUMENTS

JP  2001-036343  2/2001
JP  2002-190710  7/2002

* cited by examiner

Primary Examiner—Joseph Chang
(74) Attorney, Agent, or Firm—Muirhead and Saturnelli, LLC

(57) ABSTRACT

A temperature compensated crystal oscillator has a package body, a crystal blank hermetically sealed in a first recess of the package body, and an IC chip which includes an oscillation circuit electrically connected to the crystal blank, and a temperature compensating mechanism for compensating the crystal blank for the frequency-temperature characteristic. The oscillation circuit and temperature compensating mechanism are integrated into the IC chip. The IC chip is received in a second recess of the package body such that a circuit formation surface thereof faces the bottom face of the package body. External write terminals are formed on a principal surface of the IC chip, which is not the circuit formation surface, for writing temperature compensation data into the temperature compensating mechanism.

9 Claims, 3 Drawing Sheets

US 7,256,659 B2

TEMPERATURE COMPENSATED CRYSTAL OSCILLATOR AND METHOD OF MANUFACTURING SAME

BACKGROUND OF THE INVENTION

1. Field of the Invention

The present invention is directed to the field of a temperature compensated crystal oscillator (TCXO) of a surface mount type and a method of manufacturing the same, and relates particularly to a temperature compensated crystal oscillator which eliminates write terminals provided in a package body for writing temperature compensation data thereinto, thereby promoting a further reduction in outer dimensions.

2. Description of the Related Art

A temperature compensated crystal oscillator which integrates a quartz crystal unit, an oscillation circuit which uses the crystal unit, and a temperature compensating mechanism for compensating the crystal unit for the temperature-frequency characteristic has ability to prevent variations in oscillation frequency caused by variations in ambient temperature. Such a temperature compensated crystal oscillator is widely used as a reference source of the frequency, particularly, in devices used under mobile environments, for example, in portable telephones. In the temperature compensated crystal oscillator, an oscillation circuit and a temperature compensating mechanism is typically integrated into a single IC (integrated circuit) chip.

There are a variety of methods for compensating the temperature compensated crystal oscillator for the temperature. Variations in the resonance frequency of a crystal unit in response to the ambient temperature, i.e., the temperature-frequency characteristic subtly differs from one crystal unit to another. Therefore, for ensuring a fixed oscillation frequency over a wide temperature range in the temperature compensated crystal oscillator, the temperature characteristic of its oscillation frequency must be actually measured after the assembly of the temperature compensated crystal oscillator to create temperature compensation data based on the result of the measurement, and the temperature compensation data must be written into the temperature compensating mechanism within the IC chip, thereby allowing the oscillator to accomplish an optimal compensation for the temperature in accordance with its crystal unit. A conventional temperature compensated crystal oscillator has a crystal unit and an IC chip contained in a package, and write terminals arranged on the surface of the package body, so that temperature compensation data is written into the IC chip from the write terminals.

FIGS. 1A and 1B illustrate a conventional temperature compensated crystal oscillator which has write terminals on the surface of a package body, as described above.

The illustrated temperature compensated crystal oscillator comprises package body 1 for use in surface mounting; crystal blank 2 which functions as a crystal unit; and IC chip 3. Package body 1 is made, for example, of laminate ceramics in the shape of low-profile rectangular solid, wherein recesses 1A, 1B are formed in both principal surfaces, respectively. Therefore, package body 1 has an H-shaped cross-section, as illustrated in FIG. 1A. When package body 1 is surface-mounted on a wiring board, it is placed on the wiring board with recess 1B facing the wiring board.

Crystal blank 2 is accommodated in recess 1A, and cover 5 is bonded to package body 1 to close an opening face of recess 1A, thereby hermetically sealing crystal blank 2 in recess 1A. Crystal blank 2 is, for example, a substantially rectangular AT-cut quartz crystal blank, which is formed with excitation electrodes, not shown, on both principal surfaces, respectively. Extension electrodes extend from this pair of excitation electrodes to both ends of one side of crystal blank 2. Then, both the ends of the one side of crystal blank 2, to which the extension electrodes extend, are secured to the bottom face of recess 1A of package body 1 with conductive adhesive 4 or the like, so that crystal blank 2 is held in recess 1A.

As illustrated in FIG. 2, IC chip 3 comprises oscillation circuit 21 connected to crystal blank 2; and temperature compensating mechanism 22; for generating a temperature compensation signal for compensating crystal blank 2 as a crystal unit for the temperature-frequency characteristic in accordance with the ambient temperature, and supplying the temperature compensation signal to oscillation circuit 21. The two components are integrated in IC chip 3. IC chip 3 is manufactured using a silicon semiconductor substrate or the like through a general semiconductor device fabrication process. In IC chip 3, circuits such as oscillation circuit 21, temperature compensating mechanism 22 and the like are disposed on one principal surface of a semiconductor substrate which forms part of IC chip 3. Therefore, one of both principal surfaces of IC chip 3, which is formed with the oscillation circuit, temperature compensating mechanism and the like, is called "circuit formation surface 3A."

As Illustrated in FIG. 3, circuit formation surface 3A of IC chip 3 is provided with a plurality of IC terminals 6 along its periphery. IC terminals 6 are provided for electrically connecting parts and circuits external to IC chip 3 to the circuits internal to IC chip 3. Such IC terminals 6 include a pair of crystal connection terminals (XTAL), a power terminal (VDD), an output terminal (OUT), a ground terminal (GND), and for example, four write terminals 6a directed to temperature compensating mechanism 22. Circuit terminals are formed corresponding to the IC terminals on the bottom face of recess 1B of package body 1, so that IC chip 3 is electrically and mechanically connected to package body 1 by securing the IC terminals of IC chip 3 to the associated circuit terminals, for example, through ultrasonic thermocompression bonding using bumps 7.

Among IC terminals 6, the pair of crystal connection terminals (XTAL) are connected to crystal blank 2 through the circuit terminals, conductor paths, not shown, formed on package body 1, and the aforementioned conductive adhesive 4. Remaining IC terminals 6, including write terminals 6a, extend to the outer surface of package body 1 through conductor paths, not shown.

Among several surfaces of package body 1, mounting electrodes 8 for use in surface mounting are formed at four corners, respectively, of a surface which is positioned to face the wiring board upon surface mounting. Then, among IC terminals 6, the power terminal (VDD), output terminal (OUT), and ground terminal (GND) extend to mounting electrodes 8, respectively, by way of through-holes, not shown, formed through four corners of package body 1. Four write terminals 6a of IC chip 3 are electrically connected to external write terminals 6A formed on a side surface of package body 1 through conductor paths. Two of external write terminals 6A are arranged on, for example, each of one pair of side surfaces along the longitudinal direction of package body 1.

For protecting circuit formation surface 3A of IC chip 3, protective resin 9 is injected as so-called under-fill between the bottom face of recess 1B and circuit formation surface 3A in recess 1B of package body 1.

In the temperature compensated crystal oscillator as described above, oscillation circuit 21 is operated, while crystal blank 2 is accommodated in recess 1A to make up a crystal unit, to measure the characteristic of the oscillation frequency with respect to the temperature. Then, temperature compensation data is created for compensating the crystal unit for the frequency-temperature characteristic based on the result of the measurement, and such temperature compensation data is written into a memory circuit of temperature compensating mechanism 22 within IC chip 3 from four external write terminals 6A arranged on the side surfaces of package body 1. After the temperature compensation data has been written, temperature compensating mechanism 22 generates a compensation voltage adapted to the frequency temperature characteristic of crystal blank 2 in accordance with the ambient temperature, and this compensation voltage is supplied to oscillation circuit 21. Oscillation circuit 21 employs, for example, a voltage variable capacitance element as part of a load capacitance to the crystal unit, so that the load capacitance of the crystal unit varies in response to the ambient temperature as the compensation voltage is applied to the voltage variable capacitance element, thus accomplishing the compensation of the oscillation frequency for the temperature The temperature compensated crystal oscillator described above encounters increasing difficulties in the formation of four external write terminals 6A on the side surfaces of package body 1 as its outer dimensions are reduced more and more.

When the temperature compensation data is written, probes, not shown, used for writing data, are brought into contact with external write terminals 6A, and the data is written from the probes. Therefore, each of external write terminals 6A requires a certain area or more in order to establish an electric contact with the probe. However, with the advancement of a reduction in the outer dimensions of the temperature compensated crystal oscillator, required areas cannot be ensured for external write terminals 6A, and an electric contact can be induced between external write terminal 6A and mounting electrode 8 due to a narrower spacing therebetween. Further, the reduction in the outer dimensions can cause difficulties in routing conductor paths for connecting write terminals 6a of IC chip 3 to external write terminals 6A. For these reasons, it is increasingly difficult to form four external write terminals 6A on the side surfaces of package body 1.

Japanese Patent Laid-open Application No. 2001-36343 (JP, P2001-36343A) discloses an example of a surface-mount temperature compensated crystal oscillator which is provided with external write terminals on side surfaces thereof. Also, Japanese Patent Laid-open Application No. 2002-190710 (JP, P2002-190710A) discloses an example of a surface-mount crystal oscillator which has terminals for measuring the characteristic of a crystal unit on an outer surface of a package.

SUMMARY OF THE INVENTION

It is an object of the present invention to provide a temperature compensated crystal oscillator which is capable of preventing an electric contact of external write terminals to mounting electrodes, and is capable of a further reduction in size while it still has external write terminals.

It is another object of the present invention to provide a method of manufacturing a temperature compensated crystal oscillator which is capable of preventing an electric contact of external write terminals to mounting electrodes, and is capable of a further reduction in size while it still has external write terminals.

The first object of the present invention is achieved by a temperature compensated crystal oscillator which includes a package body formed with a first and a second recess respectively in a first and a second principal surface opposing each other, a crystal blank hermetically sealed in the first recess, an IC chip integrating an oscillation circuit electrically connected to the crystal blank, and a temperature compensating mechanism for compensating the crystal blank for a frequency-temperature characteristic, where the IC chip is received in the second recess such that a circuit formation surface thereof opposes a bottom face of the second recess, and electrically and mechanically connected to the package body, and external write terminals formed on a principal surface of the IC chip, which is not the circuit formation surface, for writing temperature compensation data into the temperature compensating mechanism.

The second object of the present invention is achieved by a method of manufacturing a temperature compensated crystal oscillator which includes a package body formed with a first and a second recess respectively in a first and a second principal surface opposing each other, a crystal blank hermetically sealed in the first recess, and an IC chip integrating an oscillation circuit electrically connected to the crystal blank, and a temperature compensating mechanism for compensating the crystal blank for a frequency-temperature characteristic, where the IC chip has external write terminals formed on a principal surface of the IC chip, which is not the circuit formation surface, for writing temperature compensation data into the temperature compensating mechanism. The method includes the steps of hermetically sealing the crystal blank in the first recess to make up a crystal unit, and securing the circuit formation surface of the IC chip to a bottom face of the second recess through ultrasonic thermo-compression bonding using bumps to build a crystal oscillator assembly, operating the crystal oscillator assembly to oscillate to measure the frequency-temperature characteristic thereof, and writing temperature compensation data found from the measured frequency-temperature characteristic into the temperature compensating mechanism through the external write terminals.

According to the present invention, the temperature compensation data can be written into the temperature compensating mechanism within the IC chip through the external write terminals which are arranged on the principal surface of the IC chip opposite to the circuit formation surface. Therefore, in comparison with external write terminals arranged on a package body, the temperature compensated crystal oscillator is less susceptible to constraints in the placement of the external write terminals, and is possible to eliminate conductor paths routed on the package body for the temperature compensation data. Therefore, the temperature compensated crystal oscillator can be formed in a smaller size.

Preferably, in the IC chip, write terminals are arranged on the circuit formation surface for electric connection to the temperature compensating mechanism, wherein the write terminals are electrically connected to the external write terminals by way of electrode through-holes which extend through the IC chip.

Also, a protective resin is preferably coated on the principal surface of the IC chip, which is not the circuit formation surface, to insulate the external write terminals after the temperature compensation data has been written.

By thus insulating the external write terminals, electric insulation can be established between a wiring board and the external write terminals when the temperature compensated crystal oscillator is mounted on the wiring board.

DETAILED DESCRIPTION OF THE PREFERRED EMBODIMENT

Figure 1A:
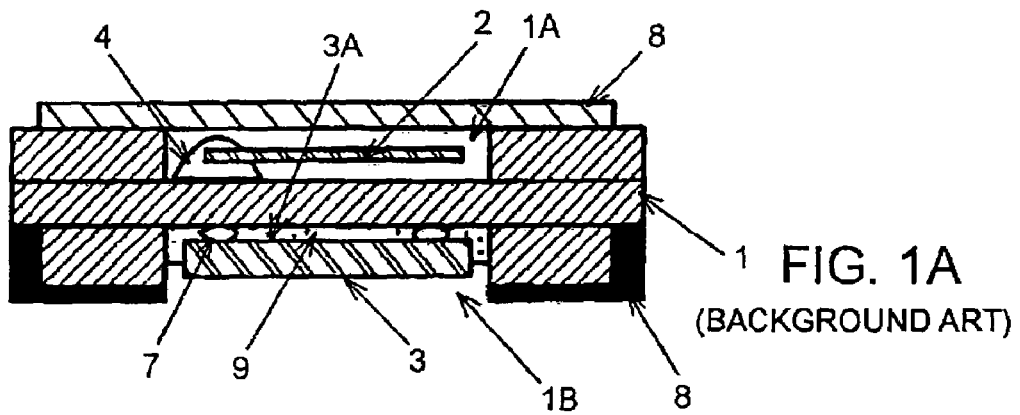
FIGS. 1A and 1B are a cross-sectional view and a side view, respectively, of a conventional temperature compensated crystal oscillator.
Figure 1B:
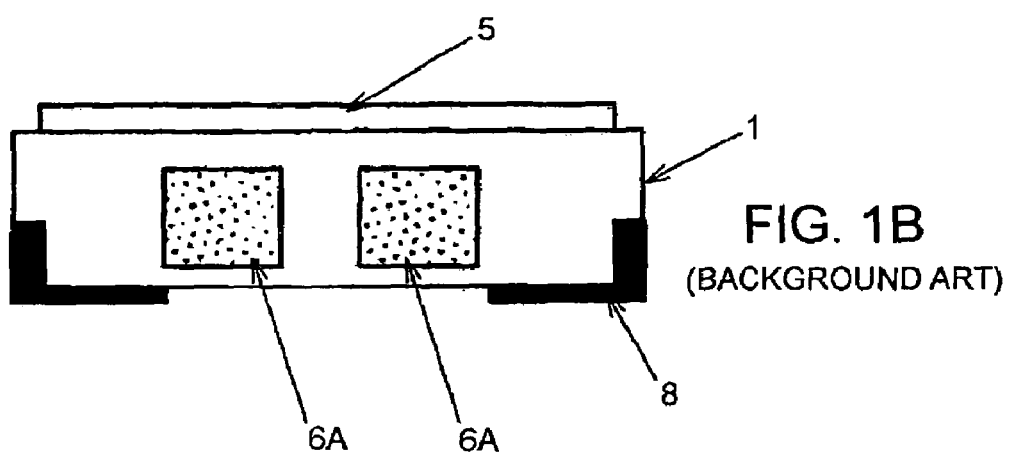
Figure 2:
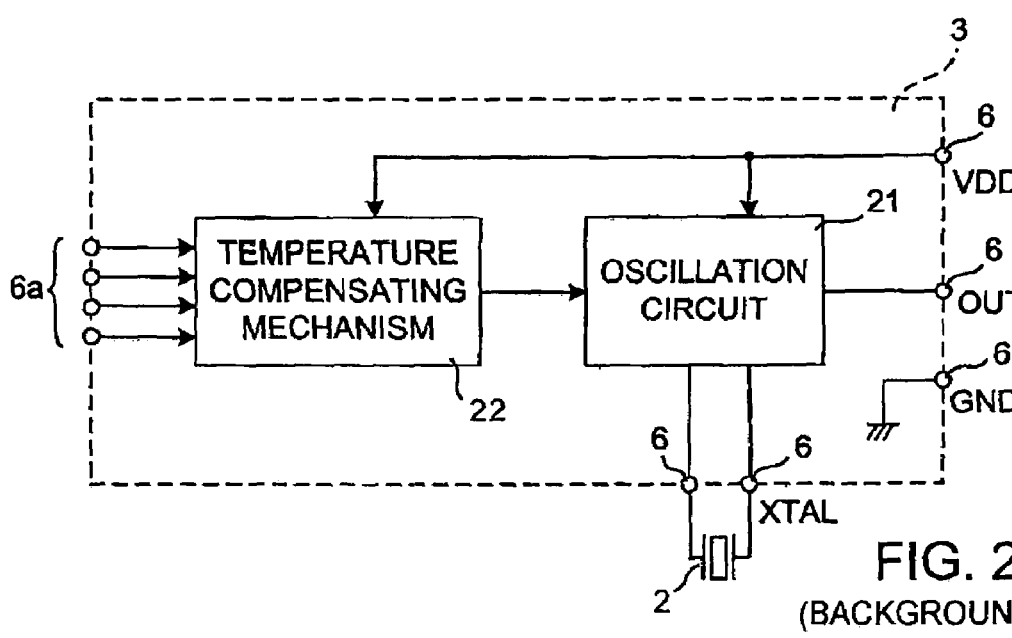
FIG. 2 is a block diagram illustrating the circuit configuration of a temperature compensated crystal oscillator.
Figure 3:
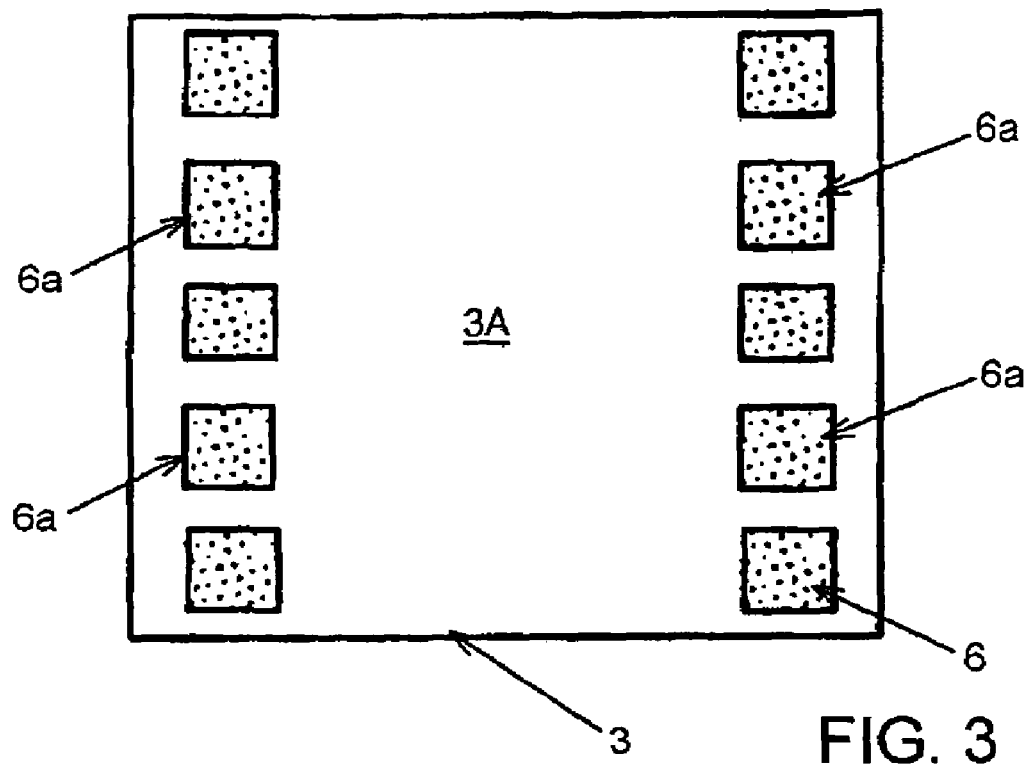
FIG. 3 is a plan view illustrating a circuit formation surface of an IC chip which is used in the conventional temperature compensated crystal oscillator illustrated in FIGS. 1A and 1B.
Figure 4:
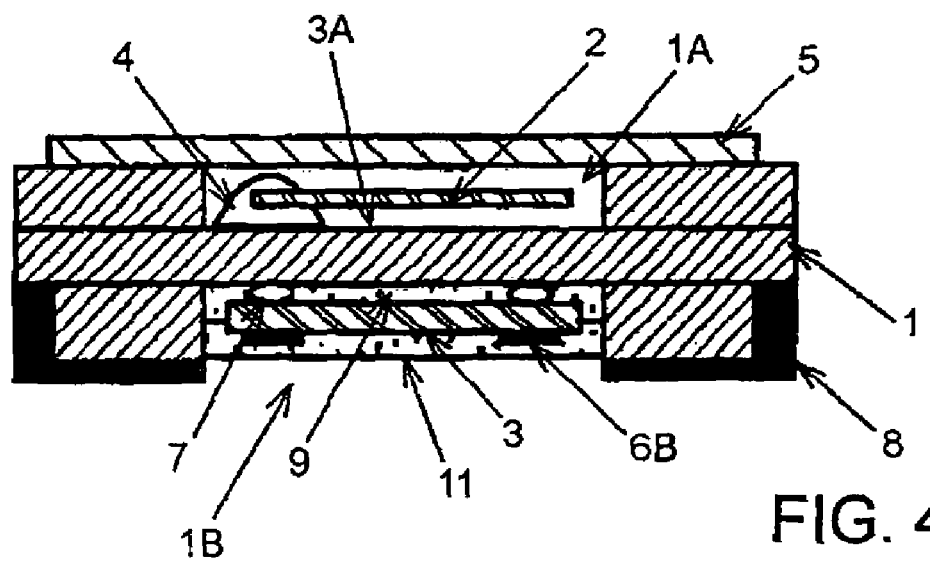
FIG. 4 is a cross-sectional view illustrating a temperature compensated crystal oscillator according to one embodiment of the present invention.
Figure 5A:
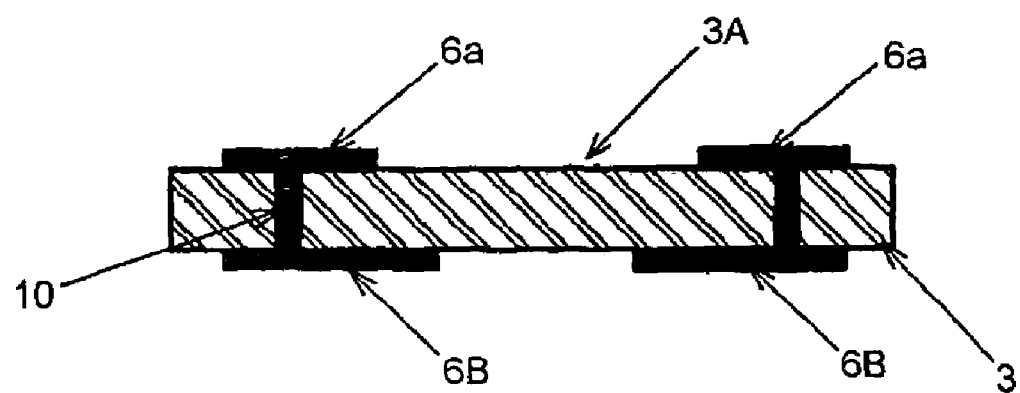
FIG. 5A is a cross-sectional view of an IC chip which is used in the temperature compensated crystal oscillator illustrated in FIG. 4.
Figure 5B:
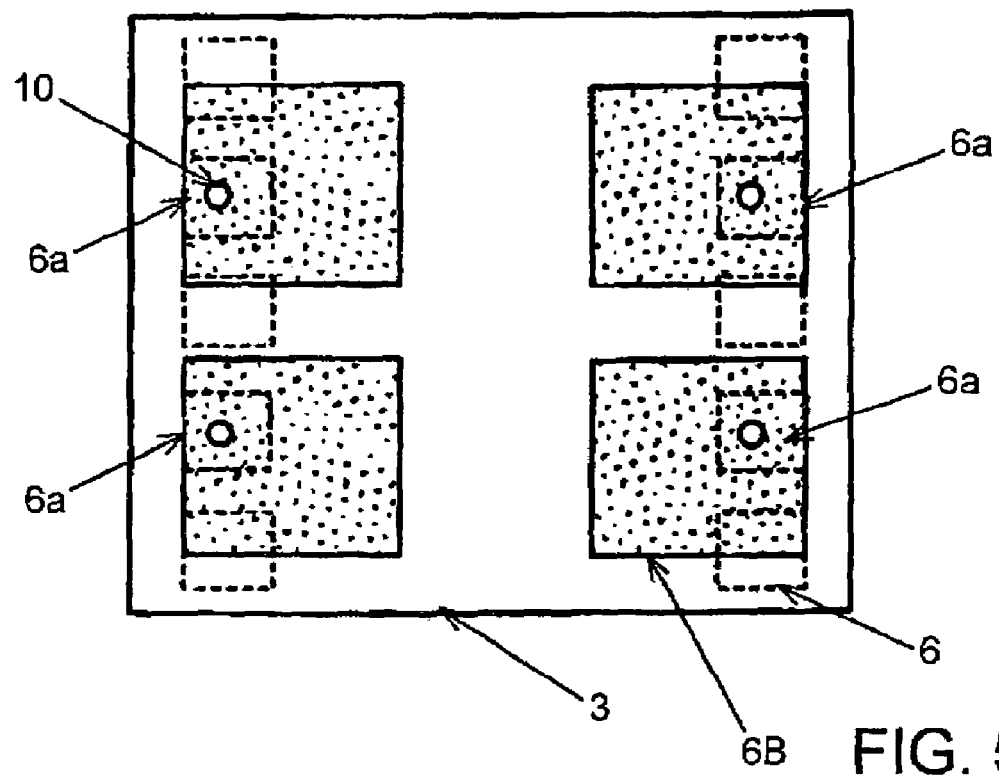
FIG. 5B is a plan view illustrating a principal surface, which is not a circuit formation surface, of the IC chip used in the temperature compensated crystal oscillator illustrated in FIG. 4.

In FIGS. 4, 5A and 5B which illustrate a temperature compensated crystal oscillator according to a preferred embodiment of the present invention, components identical to those in FIGS. 1A, 1B, 2 and 3 are designated the same reference numerals, and repeated descriptions are simplified.

A temperature compensated crystal oscillator illustrated in FIG. 4 is similar to the aforementioned one in that it comprises package body 1 for use in surface mounting; crystal blank 2 which functions as a crystal unit; and IC chip 3. IC chip 3 has an internal circuit configuration similar to that illustrated in FIG. 2. Recesses 1A, 1B are formed in both principal surfaces of package body 1, respectively. Crystal blank 2 is secured to the bottom face of recess 1A with conductive adhesive 4 in a manner similar to the aforementioned, and is hermetically sealed within recess 1A by cover 5 which closes recess 1A. 1C chip 3 is contained in recess 1B. Mounting electrodes 8 for power supply, grounding, oscillation output and the like are formed at four corners of the principal surface of package body 1 which is formed with recess 1B.

In the temperature compensated crystal oscillator of this embodiment, external write terminals for writing temperature compensation data into IC chip 3 from the outside are not arranged on side surfaces of package body 1 but on the bottom of IC chip 3, i.e., the principal surface which is not circuit formation surface 3A.

A plurality of IC terminals 6, including four write terminals 6a for connection to temperature compensating mechanism 22, are formed on circuit formation surface 3A of IC chip 3, in a manner similar to the aforementioned. Here, as illustrated in FIG. 5A, four write terminals 6a are guided to the back of IC chip 3, i.e. the principal surface which is not circuit formation surface 3A, by way of electrode through-holes 10 extending through IC chip 3, and electrically connected to external write terminals 6B formed on the back of IC chip 3. As illustrated in FIG. 5B, external write terminals 6B are formed larger than write terminals 6a on circuit formation surface 3A. In FIG. 5B, broken lines indicate the positions at which IC terminals 6 and write terminals 6a are formed on circuit formation surface 3A.

On the back of IC chip 3, an oxide film, not shown, made of $SiO_2$ or the like, is formed as a protective layer, so that external write terminals 6B are formed on such an oxide film.

IC chip 3 is electrically and mechanically connected to package body 1 by securing respective IC terminals 6 of circuit formation surface 3A to the associated circuit terminals on the bottom face of recess 1B through ultrasonic thermo-compression bonding using bumps 7 in a manner similar to the aforementioned. Here, protective resin layer 9 is also formed between the bottom face of recess 1B and circuit formation surface 3A of IC chip 3 as under-fill.

The temperature compensated crystal oscillator as described above is then operated to oscillate for measuring the frequency-temperature characteristic of the oscillation frequency, and temperature compensation data is created based on the result of the measurement. Then, probes for semiconductor device are brought into contact with external write terminals 6B to write the temperature compensation data into a memory circuit within temperature compensating mechanism 22. Here, the probes for semiconductor device refer to those probes which are used during the manufacturing of semiconductor devices for testing IC's or LSI's (Large-scale Integrated Circuit) in bear chip state.

After the temperature compensation data has been written into temperature compensating mechanism 22 in the foregoing manner, external write terminals 6B will never be used, so that protective resin 11 are coated over the entire back of IC chip 3 to insulate external write terminals 6B. It should be noted that, if external write terminals 6B are internally isolated from the circuit after the writing of the temperature compensation data, the layer of protective resin 11 is not necessarily provided.

In the temperature compensated crystal oscillator of the this embodiment, since the temperature compensation data is written from external write terminals 6B formed on the opposite surface of IC chip 3 through the probes for use in testing of semiconductor devices, external write terminals need not be formed on the outer surface of package body 1, or the formation of conductor paths from IC chip 3 to the outer surface is not either needed for writing the temperature compensation data. Therefore, according to this embodiment, a further reduction can be accomplished in the outer dimensions of the temperature compensated crystal oscillator. In addition, since protective resin 11 is applied and cured on external write terminals 6B for insulation after the temperature compensation data has been written, it is possible to prevent an electric contact of a wiring board on which the temperature compensated crystal oscillator is mounted with the external write terminals, and the like. Further, protective resin 11 prevents IC chip 3 from being damaged even if this IC chip collides against a certain object during the manufacturing process of the temperature compensated crystal oscillator.

In the example described above, the frequency-temperature characteristic is measured after protective resin layer 9 has been formed for functioning as under-fill Alternatively, the formation of the under-fill may be preceded by the measurement of frequency-temperature characteristic and the writing of temperature compensation data, followed by simultaneous and integral formation of a protective resin layer for under-fill and a protective resin layer for insulating external write terminals 6B.

What is claimed is:

1. A temperature compensated crystal oscillator comprising:
   a package body formed with a first and a second recess respectively in a first and a second principal surface opposing each other;
   a crystal blank hermetically sealed in said first recess;
   an IC chip integrating an oscillation circuit electrically connected to said crystal blank, and a temperature compensating mechanism for compensating said crystal blank for a frequency-temperature characteristic;
   said IC chip being received in said second recess such that a circuit formation surface thereof opposes a bottom face of said second recess, and electrically and mechanically connected to said package body; and
   external write terminals formed on a principal surface of said IC chip, which is not said circuit formation surface, for writing temperature compensation data into said temperature compensating mechanism.

2. The crystal oscillator according to claim 1, further comprising write terminals formed on said circuit formation surface for electric connection to said temperature compensating mechanism, wherein said write terminals are electrically connected to said external write terminals by way of electrode through-holes which extend through said IC chip.

3. The crystal oscillator according to claim 1, further comprising a protective resin layer deposited on the principal surface of said IC chip, which is not said circuit formation surface, for covering and insulating at least said external write terminals.

4. The crystal oscillator according to claim 1, further comprising mounting electrodes formed on an outer surface of said package body for use in surface-mounting said temperature compensated crystal oscillator on a wiring board and for electric connection to said IC chip.

5. The crystal oscillator according to claim 3, further comprising mounting electrodes formed on an outer surface of said package body for use in surface mounting said temperature compensated crystal oscillator on a wiring board and for electric connection to said IC chip.

6. The crystal oscillator according to claim 5, wherein said mounting electrodes are positioned at four corners of said second principal surface of said package body.

7. A method of manufacturing a temperature compensated crystal oscillator comprising a package body formed with a first and a second recess respectively in a first and a second principal surface opposing each other, a crystal blank hermetically sealed in said first recess, and an IC chip integrating an oscillation circuit electrically connected to said crystal blank, and a temperature compensating mechanism for compensating said crystal blank for a frequency-temperature characteristic, said IC chip having external write terminals formed on a principal surface thereof, which is not a circuit formation surface, for writing temperature compensation data into said temperature compensating mechanism, said method comprising the steps of:
   hermetically sealing said crystal blank in said first recess to make up a crystal unit, and securing said circuit formation surface of said IC chip to a bottom face of said second recess through ultrasonic thermo-compression bonding using bumps to build a crystal oscillator assembly;
   operating said crystal oscillator assembly to oscillate to measure a frequency-temperature characteristic thereof; and
   writing temperature compensation data found from the measured frequency-temperature characteristic into said temperature compensating mechanism through said external write terminals.

8. The method according to claim 7, wherein said IC chip comprises write terminals arranged on said circuit formation surface for electric connection to said temperature compensating mechanism, and said write terminals are electrically connected to said external write terminals by way of electrode through-holes which extend through said IC chip.

9. The method according to claim 7, further comprising the step of, after writing the temperature compensation data, coating a protective resin on the principal surface of said IC chip, which is not said circuit formation surface, to insulate said external write terminals.

* * * * *